United States Patent [19]

Raymond

[11] Patent Number: 4,510,436

[45] Date of Patent: Apr. 9, 1985

[54] DIELECTRIC MEASURING SYSTEMS

[75] Inventor: Leonard S. Raymond, Tucson, Ariz.

[73] Assignee: Southwest Medical Products, Incorporated, Tucson, Ariz.

[21] Appl. No.: 399,126

[22] Filed: Jul. 15, 1982

[51] Int. Cl.³ .................................................. G01R 27/26
[52] U.S. Cl. ................................ 324/61 P; 324/61 R; 73/304 C
[58] Field of Search ............. 73/304 R, 304 C, 74; 340/870.37; 324/61 R, 61 P, 61 QS, 65 R, 65 P

[56] References Cited

U.S. PATENT DOCUMENTS

| | | | |
|---|---|---|---|
| 3,215,931 | 11/1965 | Schooley | 324/61 QS |
| 3,774,237 | 11/1973 | Hardway | 324/61 R |
| 3,774,238 | 11/1973 | Hardway | 324/61 R |
| 3,986,110 | 10/1976 | Overall | 324/61 P X |
| 4,266,188 | 5/1981 | Thompson | 324/61 R X |

Primary Examiner—Stanley T. Krawczewicz
Assistant Examiner—Jose M. Solis
Attorney, Agent, or Firm—Schiller & Pandiscio

[57] ABSTRACT

A capacitive transducer which comprises a pair of joined-together thin-film capacitors and a fluid-impervious container. The container may be filled with a standard solution of known composition. One of the two thin-film capacitors is immersed in the standard solution inside the container while the other is situated outside the container. The entire transducer may be immersed in a sample, and the capacitance of the outside capacitor, which is dependent on the dielectric constant of the sample, may be compared with that of the inside capacitor after the standard solution has reached thermal equilibrium with the sample.

22 Claims, 5 Drawing Figures

DIELECTRIC MEASURING SYSTEMS

BACKGROUND OF THE INVENTION

The present invention relates to dielectric transducers and more specifically to dielectric transducers for use in testing or monitoring fluids.

It is well known that the dielectric properties of a sample may be useful in the assay of the sample. For example, the concentration of the constituents of a solution of two materials having different relative dielectric constants may be readily determined by measuring the dielectric constant of the solution. Typically, the dielectric constant of the sample is measured by capacitive methods, the sample providing all or part of the dielectric material separating the plates of a capacitor. From the geometry of the capacitor and its measured capacitance, the dielectric constant of the sample may be deduced. This value may then be compared with a calibration curve or table of values of the dielectric constant for varying known concentrations of the materials of interest. Typically, such values may be determined by directly substituting known concentrations of the materials in the capacitor.

To be directly comparable, the measurement of the sample must be made under identical conditions to those pertaining to the calibration. Thus, for instance, it is known that the dielectric constant of a material is temperature dependent. For example, the dielectric constants of most polar liquids vary inversely with the temperature. Because of such variations, all measurements of the sample should ideally be made at a pre-established temperature. Alternatively, the effects of the temperature dependence of the dielectric constant must otherwise be accounted for, as by measuring the temperature of the sample and applying an emperically determined correction factor to the capacictance measurement. While such approaches are consistent with standard laboratory practice, the requirement for temperature control or for a separate temperature measurement taken together with an independently determined thermal calibration curve detracts from the potential usefulness of such methods in many process control applications or in consumer goods.

Accordingly, it is a purpose of the present invention to provide a capacitive transducer suitable for the measurement of the dielectric properties of a sample and which incorporates a simple built-in reference standard, thereby insuring calibration of the transducer under varying conditions. It is a further object of the present invention to provide such a transducer which is temperature compensated.

These and other objects are met in the present invention of a capacitive transducer which comprises a pair of joined-together thin-film capacitors and a fluid-impervious container. The container may be filled with a standard solution of known composition. One of the two thin-film capacitors is immersed in the standard solution inside the container while the other is situated outside the container. The entire transducer may be immersed in a sample, and the capacitance of the outside capacitor, which is dependent on the dielectric constant of the sample, may be compared with that of the inside capacitor after the standard solution has reached thermal equilibrium with the sample.

It will be appreciated that the transducer so far described has the convenience of a self-contained reference standard as well as provision for thermal compensation. Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

BRIEF DESCRIPTION OF THE DRAWINGS

For a fuller understanding of the nature and objects of the present invention, reference should be had to the following detailed description taken in connection with the accompanying drawing wherein.

In the various views, like parts are designated by like index numbers.

DETAILED DESCRIPTION OF THE DRAWINGS

Figure 1:
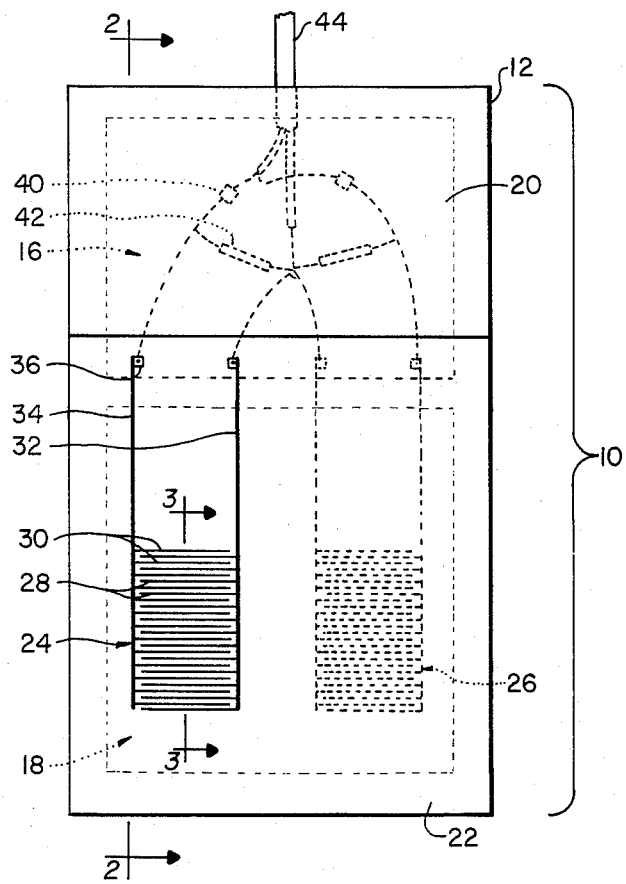
FIG. 1 is a front view of a transducer which is a preferred embodiment of the present invention.
Figure 2:
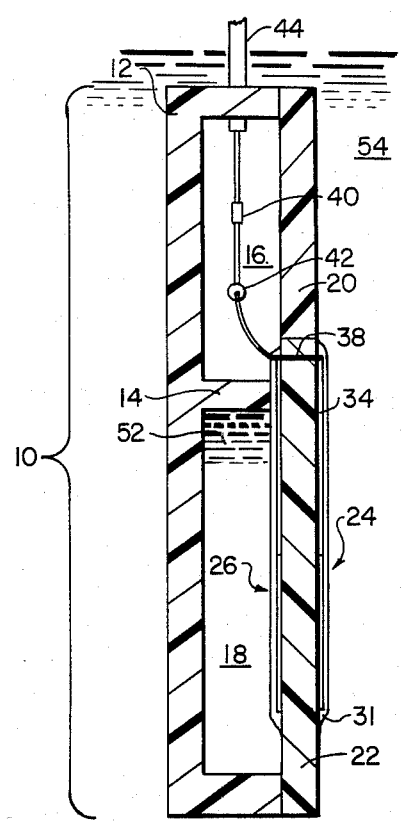
FIG. 2 is a cross-sectional view of the transducer of FIG. 1 taken along the line 2—2 of FIG. 1.

Referring to FIGS. 1 and 2, there may be seen a transducer 10 which constitutes a preferred embodiment of the present invention. Transducer 10 is built upon and in a rectangular case 12 fabricated from an electrically insulating material chosen to be impervious and non-reactive to the fluids of interest. For example, for use with dilute acids, such as sulfuric acid in water, rectangular case 12 may be fabricated from a fluoroplastic such as polyvinyldene fluoride. For use with other fluids, different materials may be used, as will be apparent to those skilled in the art.

Rectangular case 12 is a thin-walled hollow structure divided by central partition 14 into chambers 16 and 18. Access to chambers 16 and 18 is provided by covers 20 and 22 respectively. Covers 20 and 22 are laminae dimensioned to completely cover the open face of rectangular case 12, abutting one another opposite chamber 16. Cover 20 may be of the same material as rectangular case 12, while cover 22, which serves as a substrate for a micro-electronic circuit, as will be described hereinafter, is preferably chosen from a smooth, polished, electrically insulating, thermally conductive material such as sapphire, quartz, glass, or alumina.

Referring to FIG. 1, it may be seen that cover 22 is provided with a pair of interdigitated capacitors 24 and 26. Capacitors 24 and 26 are thin film interdigitated capacitors deposited on opposite faces of cover 22. In a preferred embodiment, capacitors 24 and 26 are identical in structure; consequently only capacitor 24 will be described in detail, it being understood that similar detail applies to capacitor 26.

Capacitor 24 is formed of a plurality of parallel, equally spaced-apart, electrodes 28 interdigitated with a similar plurality of parallel electrodes 30. A pair of parallel spaced-apart busses 32 and 34, disposed normal to the electrodes, are electrically connected to opposite ends of electrodes 28 and 30 respectively. Buses 32 and 34 are each provided with an electrically connected contact pad 36 remote from electrodes 28 and 30. A pair of plated through apertures 38 are preferably provided through cover 22 connecting with each contact pad 36 of capacitor 24.

Electrodes 28 and 30, buses 32 and 34, and contact pads 36 are fabricated of an electrically conductive thin metallic film, such as chromium, aluminum, tungsten, titanium, tantalum, platinum, paladium, or the like. As is well known in the art, micro circuits of such thin films may be deposited by any of a number of processes, such as evaporation, sputtering, low pressure chemical vapor deposition (LPCVD), and plasma deposition. In a preferred embodiment, tungsten is grown on a sapphire substrate (cover 22) from the reaction of tungsten hexafluoride and hydrogen at a temperature of 720° C. in an LPCVD reactor. The metal is grown to a thickness of about 2000 Angstroms. The capacitor structure is delineated by standard photoetching techniques, the tungsten first being coated with a photoresist which is then exposed with the desired pattern. After development, the photoresist is washed to remove the unpolymerized portions of the resist, and the uncovered tungsten is chemically removed by an appropriate etchant. After etching, the resist is removed with an appropriate solvent, leaving the tungsten electrode pattern on the sapphire substrate. Each electrode is on the order of 0.001 inch (0.025 mm) wide, disposed such that opposing electrodes are spaced apart by a similar distance (i.e., electrodes 28 or electrodes 30 are spaced apart from like electrodes by 0.003 inch [0.075 mm]). Satisfactory electrical performance has been achieved with 80 electrodes (40 each of electrodes 28 and 30) and a spacing between buses 32 and 34 of 0.140 inch (3.57 mm). It will be understood, however, that for varying applications, both the form and dimensions of the capacitors might be different.

Figures 3, 3A:
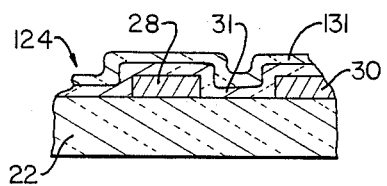
FIG. 3 is an enlarged fragmentary cross-sectional view of a portion of the transducer of FIG. 1 taken along the line 3—3 of FIG. 1.
FIG. 3A is a view, similar to that of FIG. 3, of an alternative embodiment of the transducer of FIG. 1.

As may best be seen in FIG. 3, each capacitor 24 (and 26) is further overcoated with a dielectric layer 31. Dielectric layer 31 is chosen not only for its dielectric properties but also so as to be impervious to the fluids of interest. Dielectric layer 31 serves as a mechanical and chemical protective barrier over electrodes 28 and 30 and busses 32 and 34 of capacitors 24 and 26. More importantly, for transducers used to monitor electrochemical processes (as, for instance, the concentration of an electrolyte in a battery or in a plating bath), layer 31 further serves to electrically insulate the capacitor from the electrolyte. Thus, both electrolysis of the electrodes and stray currents within the measuring circuit are avoided. For use with battery electrolytes, for example, dielectric layer 31 may be composed of silicon nitride, silicon dioxide, silicon oxynitride, aluminum oxide, or the like. As an example, silicon nitride can be grown by LPCVD through the reaction of silane ($SiH_4$) and ammonia. Satisfactory transducers have been made with a silicon nitride dielectric layer on the order of 3500 Angstroms thick. It will be recognized, however, that in those situations where electrical, chemical, or mechanical protection of the capacitors is not required, dielectric layer 31 could be dispensed with.

As will be described hereinafter, in operation capacitors 24 and 26 are disposed in contact with a fluid sample and a fluid reference standard, respectively, and the capacitance of the corresponding capacitor in part depends on the dielectric constant of the fluid. The capacitance due to each fluid is effectively in series with a pair of capacitors formed by the dielectric layer 31 separating the fluid from the electrodes of the corresponding capacitor 24 or 26. In addition, there is a residual capacitance in each capacitor, due to substrate 22 and the interelectrode portions of layer 31, which is effectively connected in parallel across the series-connected dielectric layer - fluid - dielectric layer capacitor. To insure that a change in fluid properties produces a sufficiently great change in the value of the corresponding capacitor 24 or 26, the series-connected capacitance due to dielectric layer 31 should be as large as possible.

As noted hereinbefore, capacitor 26 is preferably of similar structure and dimensions as capacitor 24, although, as will be described, for some purposes differing geometries and dimensions might be desireable.

Cover 22 is cemented, as by epoxy, or similarly sealed to rectangular case 12 so as to provide a fluid tight chamber 18 within which is disposed capacitor 26. Buses 32 and 34 extend beyond central partition 14 of rectangular case 12, with contact pads 36 disposed opposite (in the case of capacitor 24) and within (in the case of capacitor 26) chamber 16. Capacitors 24 and 26 are attached to one another and to external circuitry to form two arms of a capacitance bridge. The necessary connections may be made by cementing with silver epoxy, by soldering, or by similarly attaching, leads to contact pads 36.

Figure 4:
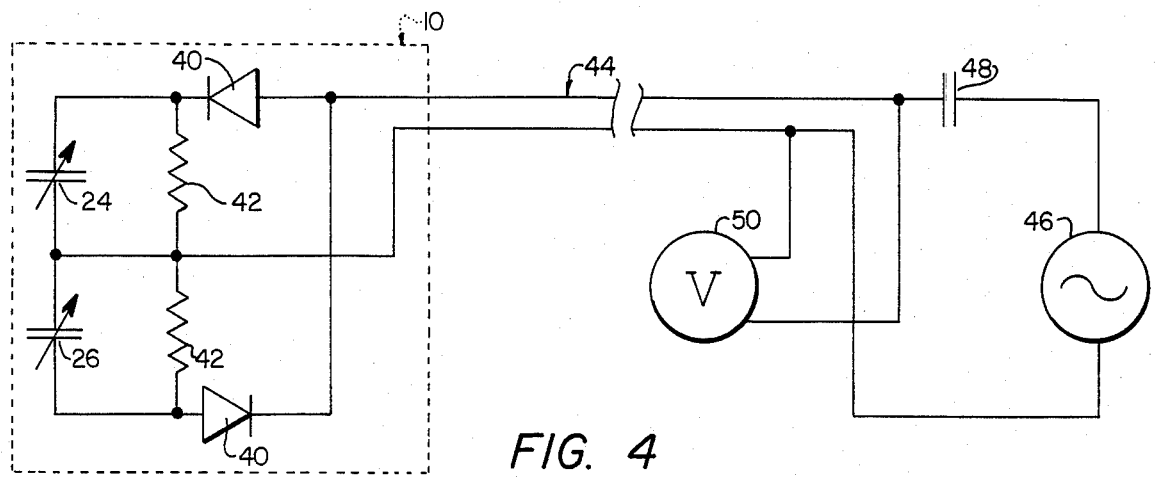
FIG. 4 is a schematic diagram of circuitry suitable for use with the transducer of FIG. 1.

An example of a suitable bridge circuit for use with the transducer is illustrated in the schematic diagram of FIG. 4. This particular circuit, which will be described here only to the extent necessary to make clear the operation of transducer 10, was originally described by D. R. Harrison, W. J. Kerwin, and G. L. Shaffer in *The Review of Scientific Instruments*, Vol. 41, No. 12, pp. 1783 ff, (December, 1970). Measurement capacitor 24 and reference capacitor 26 (both shown as variable, since capacitor 24 varies with the composition and temperature of the sample being measured and capacitor 26 varies with the temperature of the reference standard in chamber 18) are connected with diodes 40 and equal resistances 42 to form a diode-impedance bridge. As indicated, this portion of the circuitry may be contained within the body of transducer 10, diode 40 and resistors 42 being encapsulated in chamber 16. Diodes 40 are attached in parallel and with opposite polarity to one side of twin lead 44. The same side of line 44 is coupled to signal generator 46 through coupling capacitor 48. Voltmeter 50 is connected across the twin lead in parallel to signal generator 46 and coupling capacitor 48. The second line of the twin lead is center tapped between the series connected resistors 42 and the parallel series connected capacitor 24 and 26 connected to diodes 40. When signal generator 46 is activated, a D.C. voltage appears across voltmeter 50 which is directly proportional to the difference in capacitance between capacitors 24 and 26 and inversely proportional to the sum of the same two capacitances.

In operation, chamber 18 is filled with a suitable fluid reference standard 52 and the entire transducer 10 are immersed in a sample 54 of the fluid of interest (FIG. 2). Standard 52 may be introduced into chamber 18 during manufacture, or may be introduced later, as through a removable fill cap (not shown) or, via syringe, through a serum cap or septum (also not shown). Preferably, reference standard 52 is chosen to have dielectric properties similar to those of the fluid of interest. Thus, preferably standard 52 is selected to have both a dielectric constant and a temperature dependence of the dielectric constant the same as that of the sample at a particular value of the sample parameter (e.g., concentration) of interest. Under these circumstances, as capacitors 24 and 26 are of identical structure and size, they will have equal capacitances when sample 54 has the same dielectric constant as standard 52. In this case, the capacitance bridge is balanced, and a zero output voltage is indicated by voltmeter 50. Any difference in the dielectric constants of standard 52 and sample 54 results in a difference of capacitance of capacitors 26 and 24, and a coresponding positive or negative D.C. voltage will be indicated on voltmeter 50. For a given temperature of sample and standard, this voltage reading may be calibrated in units of the sample parameter of interest, with zero volts corresponding to the value established by the dielectric constant of standard 52.

As they are closely spaced on a common highly thermally conductive substrate, capacitor 26 will rapidly come into thermal equilibrium with capacitor 24. Any variations in the dielectric constant of sample 54 due to temperature changes, provided they are slow enough, will be tracked by similar variations in the dielectric constant of standard 52. In this regard, it should be noted that the entire bulk of standard 52 need not be in thermal equilibrium with the entire bulk of sample 54, since the contributions of the two fluids to the values of the respective capacitors are dominated by the fluid layers adjacent capacitors 26 and 24. Provided the dielectric constants of the two fluids exhibit the same rate of change with temperature, the zero-volt calibration point of voltmeter 50 will be independent of temperature, provided, of course, the parameter of interest is not itself temperature dependent.

The preferred embodiment described in detail may be used, for instance, as a charge level monitor in lead-acid batteries. The materials chosen are relatively impervious to the sulfuric acid electrolyte of such devices, and consequently transducer 10 can be immersed in a cell of such a battery, either through the fill hole of the cell or permanently during the manufacture of the cell. In either case, transducer 10 would be disposed with capacitor 24 totally submerged within the electrolyte of the cell and such that the electrolyte freely flows past capacitor 24, thereby insuring an unbiased measurement. In this case, chamber 18 would normally be filled with battery electrolyte of known concentration, and volmeter 50 would be calibrated in terms of electrolyte concentration, specific gravity, or level of charge, all of which may be determined from the dielectric constant of the electrolyte. For the particular value of the concentration of the electrolyte in chamber 18, identical structure of capacitors 24 and 26 would insure a concentration reading independent of temperature, even though the dielectric constant corresponding to this concentration varies.

It should be noted that the power available from a battery is dependent not only on the electrolyte concentration (charge level) but also on the temperature of the battery. That is, the electrochemical reaction speed of a given concentration of electrolyte varies with temperature. Importantly, the transducer of the present invention may be modified so as to incorporate into the output voltage a deliberate temperature dependence, thereby providing a measure of available power. This may be accomplished by varying either the constitution of standard 52 or the relative size of capacitor 24 compared to capacitor 26 (or both). By varying the relative sizes of capacitors 24 and 26 (either by a change in dimension of one relative to the other or by a change in relative dielectric constant), the rate of change with temperature of the capacitive difference between capacitors may be selected, thereby deliberately introducing a selected temperature dependence into the measurement.

For certain applications, the provision for simultaneously electrically isolating the electrodes of capacitors 24 and 26 from the fluid and providing a large value of the series capacitance due to dielectric layer 31 may best be met by a modification of the structure of the capacitor, as may be seen by reference to FIG. 3A. Capacitor 124, which may be substituted for either of capacitors 24 or 26, is provided with a plurality of dielectric overcoatings in the form of dielectric layers 31 and 131. Layers 31 and 131 are of differening materials, chosen respectively for their dielectric and insulating properties. It will be understood that layer 131 is also chosen with a view toward its mechanical and chemical properties as well. Dielectric layer 31 may be selected to have a large dielectric constant, while dielectric layer 131 may be chosen for its insulating properties. In all other respects, capacitor 124 may be similar to capacitor 24 (or 26).

As an example of a multi-layered dielectric overcoating, dielectric layer 31 may be, as in the previous example, a layer of silicon nitride (room temperature dielectric constant $\epsilon \sim 8.6$, resistivity $\sim 10^{16}$ ohm-cm), while layer 131 may be fabricated of polyimide (room temperature $\epsilon \sim 3.4$, resistivity $\sim 10^{17}$ ohm-cm). By the use of such multiple layers, it will be understood that a wide variety of series resistance and capacitance may be acheived.

It will be apparent to those skilled in the art that various other modifications to the present invention may be made without departing from the scope of the disclosure. As noted hereinbefore, the capacitances of the measuring and reference capacitors may be selected to be different from one another. Again, dielectric layer 31 may be omitted.

Further, it should be noted that the geometries of the capacitors may be different than shown herein. A comblike interdigitated electrode structure is not required, and might be replaced by, for instance, a plurality of concentrically arranged electrodes. Nor need the capacitors be fabricated by micro circuit techniques; the electrodes and busses might instead be printed, as for instance by silk screening, on a substrate. It will also be understood, particularly in this last noted variation, that the substrate might be a polymeric material.

Then, too, the reference and sample capacitors need not share the same substrate, provided that adequate thermal conductivity is maintained between them. Nor need the reference and sample capacitors be arranged on opposite faces of the substrate, a side-by-side arrangement, with chamber 18 and capacitor 26 alongside capacitor 24, being possible. Again, a blister-pack, formed of a suitable polymer, might be attached to substrate 22 to form chamber 18.

It will also be understood that the transducer is not limited to the measurement of electrolytes, but is adaptable to a variety of fluids, including liquids and gasses, and to the measurement of concentrations of various species of inorganic, organic, and biological materials in solutions and suspensions, to the detection of contaminants or pollutants, and to the monitoring of chemical processes, both in discrete samples and in flow streams.

Since these and other changes may be made in the above apparatus without departing from the scope of the invention herein involved, it is intended that all matter contained in the above description or shown in the accompanying drawing shall be interpreted in an illustrative and not a limiting sense.

What is claimed is:

1. A transducer for measuring a property related to the dielectric properties of a sample fluid, said transducer being adapted for at least partial immersion in said sample fluid and comprising in combination:
   a first capacitive sensor comprising a plurality of interdigitated coplanar electrically conductive metal film electrodes deposited on an electrically insulating substrate;
   a second capacitive sensor comprising a plurality of intedigitated coplanar electrically conductive metal film electrodes deposited on an electrically insulating substrate;
   said first and second sensors being mounted so as to be (a) mechanically and electrostatically isolated from one another and (b) in direct thermal communication with one another; and
   an enclosure surrounding said second capacitive sensor for containing a reference fluid so that said reference fluid is (a) in contact with said second capacitive sensor, (b) in fluid and electrical isolation from said first capacitive sensor and a fluid sample contacted by said first capacitive sensor and (c) in thermal communication with a fluid sample contacting said first capacitive sensor.

2. A transducer according to claim 1 wherein further said interior portion is substantially filled with said second fluid.

3. A transducer according to claim 2 wherein said first fluid is an electrolytic solution and said second fluid is a reference solution of known concentration of said electrolyte.

4. A transducer according to claim 3 wherein said electrolyte is a dilute solution of sulfuric acid.

5. A transducer according to claims 1 or 2 wherein further said first capacitive sensor and said second capacitive sensor are mounted on a common substrate and said substrate is chosen from a material of high thermal conductivity.

6. A transducer according to claim 5 wherein said substrate is a lamina.

7. A transducer according to claim 6 wherein said substrate is a material chosen from the group of materials consisting of sapphire, quartz, glass, and alumina.

8. A transducer according to claims 1 or 2 wherein said electrically conductive electrodes are fabricated from an electrically conductive thin metallic film.

9. A transducer according to claim 8 wherein said metallic film is formed from a material chosen from the group of materials including chromium, aluminum, titanium, tantalum, tungsten, platinum, and paladium.

10. A transducer according to claim 8 wherein said first and second capacitive sensors are formed of similar pluralities of similarly spaced apart parallel electrodes.

11. A transducer according to claims 1 or 2 wherein further at least one non-reactive impervious dielectric layer is superposed upon at least one of said capacitive sensors.

12. A transducer according to claim 11 wherein said dielectric layer is formed from a material chosen from the group of materials including silicon nitride, silicon dioxide, silicon oxynitride, and aluminum oxide.

13. A transducer according to claim 11 wherein said at least one dielectric layer is a pluarility of layers.

14. A transducer according to claim 13 wherein one of said plurality of dielectric layers is formed of polyimide.

15. A transducer according to claims 1 or 2 wherein further a secondary non-fluid permeable non-reactive enclosure is provided.

16. A transducer according to claims 1 or 2 wherein:
   (a) said first capacitive sensor and said second capacitive sensor are mounted on a common substrate of high thermal conductivity;
   (b) said electrically conductive electrodes are fabricated from an electrically conductive thin metallic film; and
   (c) at least one non-reactive impervious dielectric layer is superposed upon at least one of said capacitive sensors.

17. A transducer according to claim 16 wherein:
   (a) said substrate is a lamina fabricated from the group of materials including sapphire, quartz, glass, and alumina;
   (b) said first and second capacitive sensors are formed of similar pluralities of similarly spaced apart parallel electrodes; and
   (c) said at least one dielectric layer is a plurality of layers, one of said layers being formed of polyimide.

18. A transducer according to claim 5 wherein said metallic film is formed from a material chosen from the group of materials consisting of chromiun, aluminum, titanium, tungsten, platinum, and paladium.

19. A transducer according to claim 5 wherein at least one of said capacitive sensors comprises at least one dielectric layer covering the said interdigitated metal film electrodes thereof.

20. A transducer according to claim 19 wherein said dielectric layer is formed from a material chosen from the group of materials consisting of silicon nitride, silicon dioxide, silicon oxynitride, and aluminum oxide.

21. A transducer according to claim 19 wherein said at least one dielectric layer is a plurality of layers.

22. A transducer according to claim 21 wherein one of said plurality of dielectric layers is formed of polyimide.

* * * * *